(12) United States Patent
Peterson, III et al.

(10) Patent No.: US 7,242,910 B2
(45) Date of Patent: Jul. 10, 2007

(54) SELF-CALIBRATING RADIO

(75) Inventors: Eugene Harold Peterson, III, Forrest, VA (US); William Oscar Janky, Goode, VA (US)

(73) Assignee: M/A-COM, Inc., Lowell, MA (US)

( * ) Notice: Subject to any disclaimer, the term of this patent is extended or adjusted under 35 U.S.C. 154(b) by 457 days.

(21) Appl. No.: 10/357,241

(22) Filed: Feb. 3, 2003

(65) Prior Publication Data

US 2004/0152434 A1    Aug. 5, 2004

(51) Int. Cl.
    *H04B 1/40* (2006.01)
(52) U.S. Cl. ............................ 455/75; 455/77; 455/87
(58) Field of Classification Search ................ 455/75, 455/77, 87
    See application file for complete search history.

(56) References Cited

U.S. PATENT DOCUMENTS

| | | | | |
|---|---|---|---|---|
| 5,375,258 A | * | 12/1994 | Gillig | ........................ 455/87 |
| 5,875,388 A | | 2/1999 | Daughtry, Jr. et al. | ..... 455/67.1 |
| 5,940,744 A | * | 8/1999 | Uda | ............................ 455/75 |
| 5,940,747 A | * | 8/1999 | Grohgans et al. | ........ 455/168.1 |
| 6,175,280 B1 | * | 1/2001 | Lloyd et al. | ................. 331/1 R |
| 6,229,991 B1 | * | 5/2001 | Hietala et al. | ................. 455/75 |
| 6,414,554 B1 | | 7/2002 | Tilley et al. | .................. 331/14 |
| 6,463,266 B1 | | 10/2002 | Shohara | .................... 455/196.1 |
| 2001/0029171 A1 | * | 10/2001 | Inahasi | ........................ 455/118 |
| 2003/0185158 A1 | * | 10/2003 | Lucas et al. | ................. 370/252 |

OTHER PUBLICATIONS

Written Opinion of the International Searching Authority (PCT Rule 43 bis.1)) Applicant's or agent's file reference 17961 PCT, International application No. PCT/US2004/002824; International filing dated Jan. 30, 2004, Priority dated Feb. 3, 2003, Date of Mailing Jul. 7, 2004.

* cited by examiner

*Primary Examiner*—Nay Maung
*Assistant Examiner*—Andrew Wendell

(57) ABSTRACT

A self-calibrating radio is described. In one exemplary implementation, a radio signal from its local voltage controlled oscillator. The calibration system automatically calibrates the radio by: (i) receiving a reference signal having a calibrated reference frequency, (ii) comparing the local frequency to the reference frequency to determine whether there is a difference between the local frequency and the reference frequency and (iii) adjusting the local frequency by an offset frequency, if the difference between the local frequency and the reference frequency is greater than a threshold value.

13 Claims, 4 Drawing Sheets

SELF-CALIBRATING RADIO

TECHNICAL FIELD

The present invention relates generally to radio communication systems.

BACKGROUND

Government regulations in most countries require wireless devices to transmit signals within defined frequency bandwidths for a particular channel. With an ever-increasing demand for usage of wireless devices, many governments are shrinking the frequency bandwidths allowable for each channel. For instance, in the United States, the Federal Communications Commission (FCC) has reduced the public safety channel bandwidth for mobile radios from 25 KHz to 12.5 KHz with future plans to allow 6.25 kHz channel spacing. With the reduction of channel bandwidths, it has become ever more critical that each radio transmit information at accurate modulation frequencies within the maximum tolerated channel bandwidths.

Frequencies produced by radios are derived from crystals driving voltage controlled oscillators within the radios. The accuracy of the frequencies produced by the oscillators tend be affected by temperature, humidity, voltage, and a number of other factors. Such factors tend to cause the frequencies produced by the oscillators to drift over time. As a result of this frequency drift phenomenon and in light of narrower bandwidths requirements, radios need to be serviced and recalibrated more often to ensure they are operating within tolerated bandwidths.

Calibration involves removing the radios from operation and bringing them in for servicing. With larger demand for calibration maintenance due to the more stringent requirements for narrow bandwidth channels, the quantity of qualified personnel and centers able to perform these calibrations is limited. Consequently, radios can be subject to long periods of removal from operation while they are waiting to be serviced as well as an increased cost of maintenance to the user community.

Servicing involves connecting the radios to expensive calibration and test equipment and performing a large amount of manual processes that require well-educated service technicians. These manual processes tend be slow, tedious, and are prone to errors.

SUMMARY

A self-calibrating radio is described. In one exemplary implementation, a radio includes a calibration system. The radio transmits radio signals at a frequency derived from a local reference frequency within the radio. The calibration system automatically calibrates the radio by: (i) receiving a reference signal having a reference frequency, (ii) comparing the local frequency to the reference frequency to determine whether there is a difference between the local frequency and the reference frequency and (iii) adjusting the local frequency by an offset frequency, if the difference between the local frequency and the reference frequency is greater than a threshold value.

BRIEF DESCRIPTION OF THE DRAWINGS

The detailed description is described with reference to the accompanying figures. In the figures, the left-most digit(s) of a reference number identifies the figure in which the reference number first appears.

DETAILED DESCRIPTION

Exemplary Radio Architecture

Figure 1:
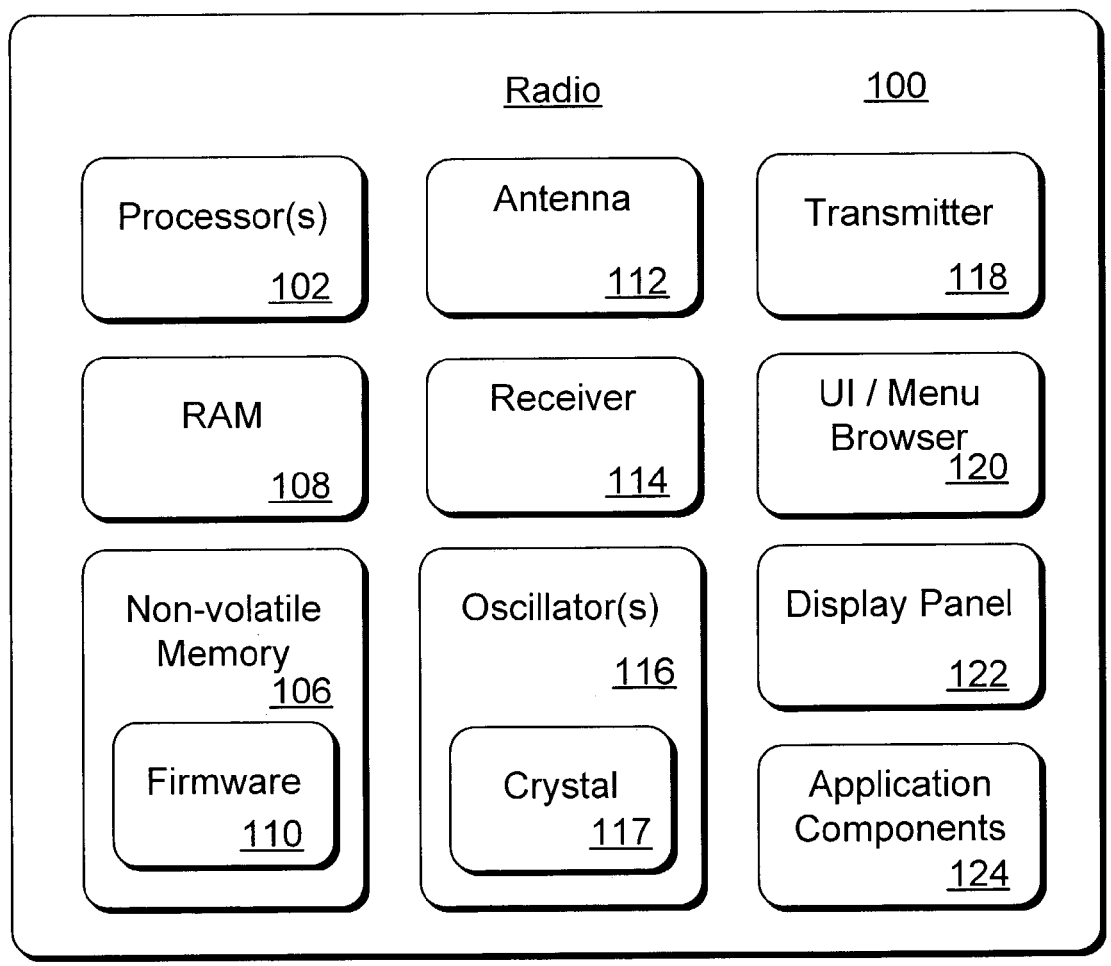
FIG. 1 is a block diagram illustrating various components of an exemplary mobile radio that can be utilized to implement the inventive techniques described herein.

FIG. 1 illustrates various components of an exemplary mobile radio 100 that can be utilized to implement the inventive techniques described herein. Radio 100 may include one or more processors 102. Processor(s) 102 execute various instructions to control the operation of the radio 100 and to communicate with other electronic, computing, and radio devices.

Radio 100 may also include a non-volatile memory 106 (such as Read-Only-Memory (ROM)), and a random access memory (RAM) 108. The memory components, i.e., non-volatile memory 106, and RAM 108, store various information and/or data such as configuration information, radio operating systems, receive or transmit data, and menu structure information. Radio 100 may include a firmware component 110 that is implemented as a permanent memory module stored in non-volatile memory 106. Firmware 110 is programmed and tested like software, and is distributed with radio 100 (or separately, such as in the form of an update). Firmware 110 can be implemented to coordinate operations of the hardware within radio 100 and contains programming constructs used to perform such operations.

Although not shown, a particular radio can also include a flash memory device as non-volatile memory 106 or in addition to non-volatile memory 106 when in the form of a read-only-memory device (ROM). Additionally, although not shown, one or more system busses typically connect the various components within radio 100 including power systems also not shown.

Radio 100 also includes a receiver 114 and transmitter 118. Receiver 114 receives an encoded signal and decodes the signal into a desired format. Transmitter 118 generates a broadcast signal that may include several signals at various frequencies. Those skilled in the art will recognize that there are many different types of receivers 114 and transmitters 118 available, and that for the purposes of this discussion, most receivers and transmitters may include any of these different types.

Both the receiver 114 and transmitter 118 may rely on one or more local oscillator(s) 116 such as a voltage controlled oscillator (VCO). In the case of the receiver 114, the local oscillator(s) 116 is used to lock onto an incoming signal, referred to as tuning. In the case of the transmitter 118, the local oscillator(s) is used to create a particular carrier frequency for signals to be transmitted. In the exemplary implementation, the VCO relies on one or more crystal(s) 117.

Antenna 112 is used as a conduit for receiving and/or transmitting signals. Some radios may use more than one antenna for transmitting or receiving signals. It should be recognized that antennas come in a variety of forms, and for purposes of this discussion any of these variety of forms may be included.

Radio 100 also includes a user interface and menu browser 120, and a display panel 122. The user interface and menu browser 120 allows a user of radio 100 to navigate the radio's menu structure. User interface 120 can include indicators or a series of buttons, switches, or other selectable controls that are manipulated by a user of the radio. Display panel 122 is a graphical display that provides information regarding the status of radio 100, messages, and the current options available to a user through the menu structure.

Radio 100 may include application components 124 that provide a runtime environment in which software applications or applets can run or execute. Those skilled in the art will recognize that there are many different types of runtime environments available. A runtime environment facilitates the extensibility of radio 100 by allowing various interfaces to be defined that, in turn, allow the application components 124 to interact with the radio.

General reference is made herein to one or more radios, such as radio 100. As used herein, "radio" means any electronic device having data communications, data storage capabilities, and/or functions to transmit and receive waves propagated through space. A radio typically uses some type of modulation, such as frequency modulation or amplitude modulation, to receive and transmit information. Examples of such radios can include, but are not limited to public safety communications equipment, portable wireless devices, radio-telephone handsets, cellular telephones, walkie-talkie type devices, and multi-function combination devices with wireless capabilities. Although specific examples may refer to one or more of these radios, such examples are not meant to limit the scope of the claims or the description, but are meant to provide a specific understanding of the described implementations.

It is to be appreciated that additional components can be included in radio 100 and some components illustrated in radio 100 above need not be included. For example, additional processors or storage devices, additional I/O interfaces, and so forth may be included in radio 100, or application components 124 may not be included.

It is also to be appreciated that the components and processes described herein can be implemented in software, firmware, hardware, or combinations thereof. By way of example, a digital signal processor (DSP), programmable logic device (PLD) or application specific integrated circuit (ASIC) could be configured or designed to implement various components and/or processes discussed herein.

System Environment

Figure 2:
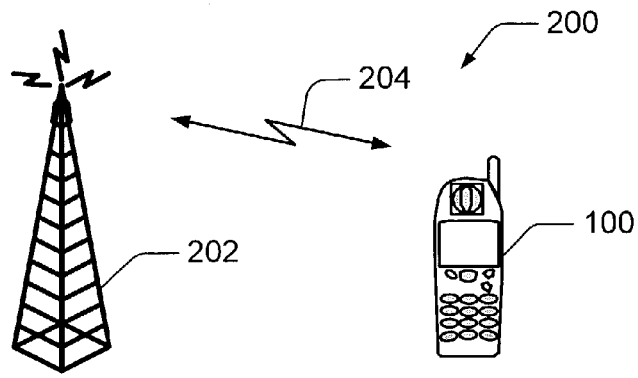
FIG. 2 is a pictorial diagram illustrating select elements used in a system environment in which an exemplary radio operates.

FIG. 2 illustrates select elements used in a system environment 200 in which radio 100 operates. Environment 200 also includes a remote source 202, which is a fixed source transceiver capable of communicating with mobile radios. Radio 100 is capable of communicating digital and/or analog data with remote source 202 via radio frequencies and vice versa. The radio frequencies of the communication channels are typically specified by regulatory rules. In the exemplary illustration, the remote source 202 is a control channel base station such as an EDACS® MASTR-III base station manufactured by Tyco Electronics Inc. or other types of bases stations capable of producing a calibrated radio signal. In the remote source 202, the transmitter and receiver radio frequencies typically are phase locked to a stable reference oscillator signal available to meet radio frequency tolerances specified by regulations. Thus, channel frequencies transmitted from remote sources 202 are generally considered to be calibrated, especially in narrowband 12.5/6.25 kHz system applications. Although not required, the control channel for a trunked communication system like EDACS® MASTR-III base station transmits continuously.

Accordingly, radio 100 is able to rely on the base station for purposes of performing calibrations as shall be described in more detail. That is, radio 100 is able to lock onto a particular signal broadcast from remote source 202 and utilize this particular signal as a "reference signal" for purposes of calibrating itself. The reference signal referred to generally as number 204 may be broadcast at any frequency supported by the radio and the remote source 202. Once the reference signal 204 is received by radio 100, radio 100 is able to compare it to signals produced locally by radio 100, and, based on the comparison of the two signals, calibrate the internal local oscillator 116. Although the reference signal 204 is shown to be broadcast from a base station in a fixed land-based location, it is possible that radio 100 can receive the reference signal 204 from other remote sources such as satellites, or even portable calibration equipment that emulate the base station transmissions.

Although environment 200 shows only one remote source 202 and radio 100 for discussion purposes, in practice, it is likely that more than one radio may receive reference signals from one or more remote sources.

Automatic Frequency Control

Figure 3:
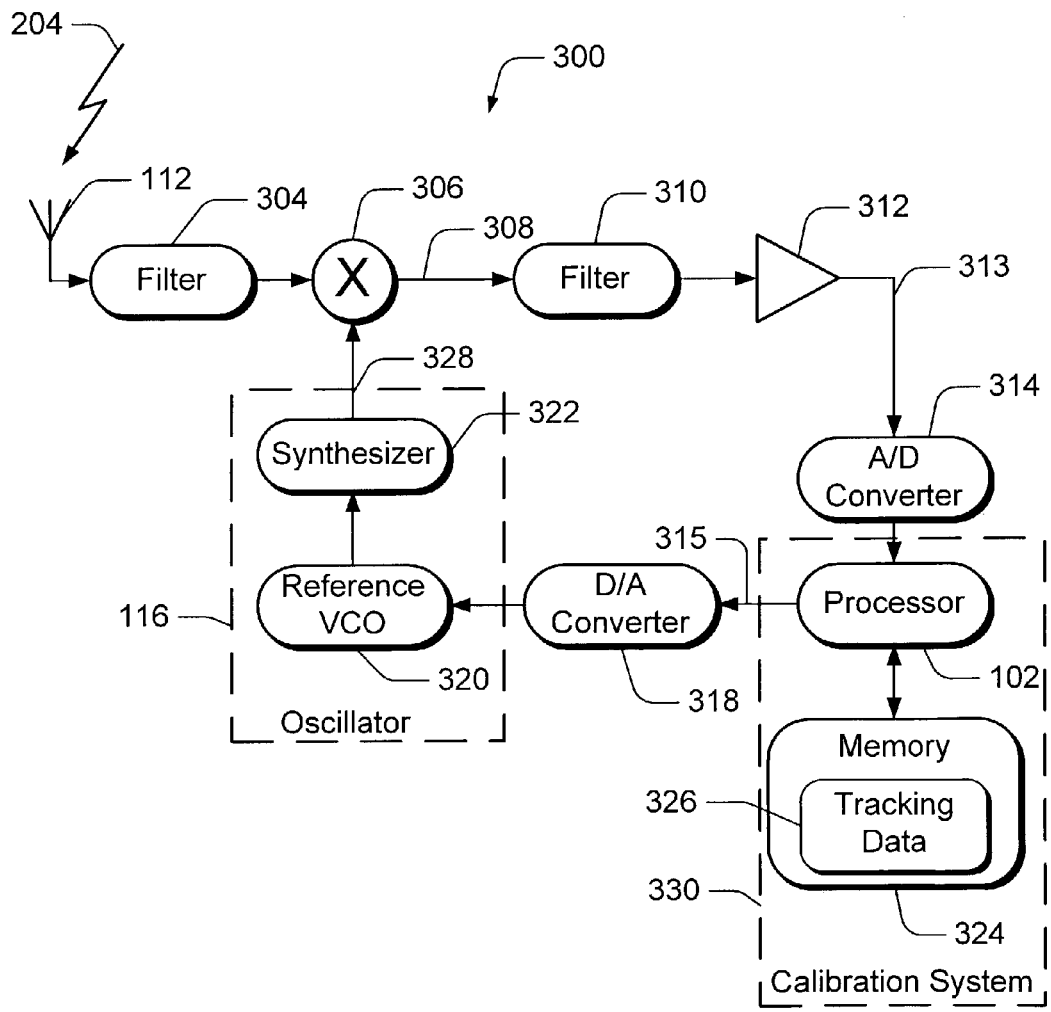
FIG. 3 is a block diagram illustrating a system configured to perform automatic calibration of a radio.

FIG. 3 illustrates a system 300 configured to perform automatic calibration. In particular, system 300 detects and adjusts for frequency differences between signals produced and transmitted locally by radio 100 when compared to a reference signal 204 received from a remote source 202, such as described with reference to FIG. 2. System 300 includes select elements from radio 100 such as an antenna 112, filters 304 and 310, a mixer 306, an amplifier 312, an analog-to-digital converter (A/D converter) 314, a digital-to-analog converter 318, a reference VCO 320, a synthesizer 322, and a calibration system 330.

Calibration system 330 performs calibration tests on radio 100 and uses the results to calibrate the transmitter 118. In this example, calibration system 330 includes processor(s) 102, memory 324 (such as non-volatile memory 106) and firmware 110 (shown in FIG. 1). Calibration system 330 controls calibration of radio 100 through the use of programmable logic and/or computer executable instructions stored in memory 324. Processor(s) 102 executes various instructions stored in memory 324 or in the form of firmware 110 to control the operation of radio 100 and to communicate with other electronic, mechanical and computing computer.

In other implementations, calibration system 330 can be implemented as pure hardware, firmware and/or software. In the exemplary implementation, processor 102 is a DSP, but may be any of the types of processors described above with reference to FIG. 1, including but not limited to: a state-machine, an Application Specific Integrated Circuit (ASIC), or one or more processor chips. Additionally, it is to be appreciated that alternative types of computer-readable memory devices could be used for memory 324 and/or firmware 110. Thus, the computer-executable instructions (including programmable logic) also could be stored on any alternative computer-readable media (RAM, DVD, Flash, etc.) including directly onto a programmable logic processor, such as a Programmable Logic Array (PLA), ASIC and other programmable processing devices.

VCO 320 may be any of the types of oscillators 116 described with reference to FIG. 1. It is to be appreciated that additional components can be included in system 300 and some components illustrated in system 300 above need not be included. For example, additional processors 102 or storage devices 322, mixers 306, filters 304 and 310, diplexers and so forth may be included in system 300.

In operation, an incoming RF signal (reference signal 204 having a reference frequency) is received by antenna 112 from a remote source 202. Filter 304 performs initial filtering of the reference signal and then the reference signal is injected into mixer 306. At approximately the same time, a local radio signal 328 is output from the combination of reference VCO 320 and synthesizer 322 and also injected into mixer 306. The combination of reference VCO 320 and synthesizer 322 form a major component of oscillator 116, which is controlled by processor 102.

Mixer 306 mixes the reference signal 204 with the radio signal 328 to generate an output signal 308, which represents the sum and difference between the reference signal and the local radio signal. The output signal 308 is further filtered by filter 310 to obtain only the difference frequency and amplified by amplifier 312. At this point, the output signal serves as a base-band signal 313 that is received by the A/D converter and converted into a digital signal for receipt by calibration system 330.

Calibration system 330 determines the difference between the radio signal and reference signal, if any. Based on this determination, calibration system 330 is able to generate a value in the form of a signal 315 that correlates into an offset correction voltage that can be applied to reference VCO 320 after being converted by the D/A converter 318 into an analog format. At this point, reference VCO 320 together with synthesizer 322 generate an adjusted radio signal 328 having a local frequency that is effectively calibrated with respect to the reference signal's reference frequency.

Memory 324 contains tracking data 326 used by processor 324 to generate the value sent as signal 315 to properly adjust the reference voltage generated by reference VCO 320. Tracking data 326 provides a basis for radio 100 to initially calibrate reference VCO 320. Based on the difference between the reference signal and radio signal, processor 102 can also update at least a portion of the tracking data to ensure that the frequency produced by VCO 320 is adjusted with respect to the newly generated offset correction voltage. Thus, calibration system 330 is able to reconfigure tracking data used to control the reference VCO 320 by updating the tracking data stored in memory 324.

Figure 4:
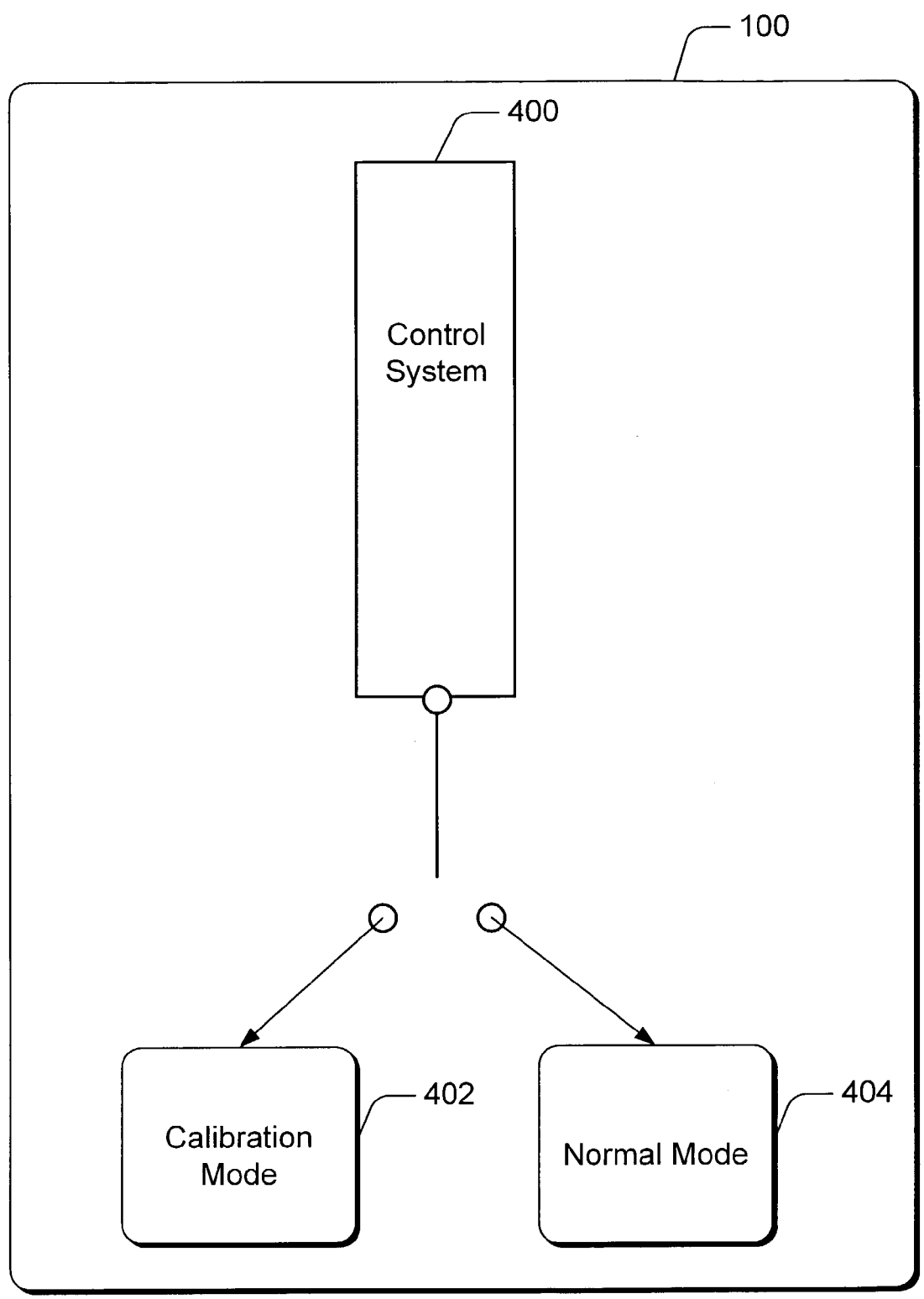
FIG. 4 is a block diagram of a radio having a control system operable in a selectable one of a calibration mode and/or a normal mode.

FIG. 4 is a block diagram of a radio having a control system operable in a selectable one of a calibration mode 402 and/or a normal mode 404. Both modes can be used in parallel at the same time or independently at different times. Control system 400 represents processor(s) 102 executing computer-executable instructions from one or more computer-readable media used to store the computer executable instructions. The one or more computer-readable media include, but are not necessarily limited to, non-volatile memory 106, RAM 108, and firmware 110. It should also be noted that control system 400 could also take the form of a hardware device in the form of programmable logic.

The calibration mode 402 involves calibrating radio 100 by receiving a reference signal 204 (FIG. 2) having the reference frequency. As explained above, the reference signal 204 is compared to the radio signal having a local frequency produced by the oscillator 116. If there is a difference between the local frequency and the reference frequency, then radio 100 is capable of generating an offset frequency based on the corrected voltage applied to reference VCO 320 as explained above with reference to FIG. 3. The normal mode 404 involves transmitting the radio signal by continuously adjusting the local frequency by the offset frequency.

Figure 5:
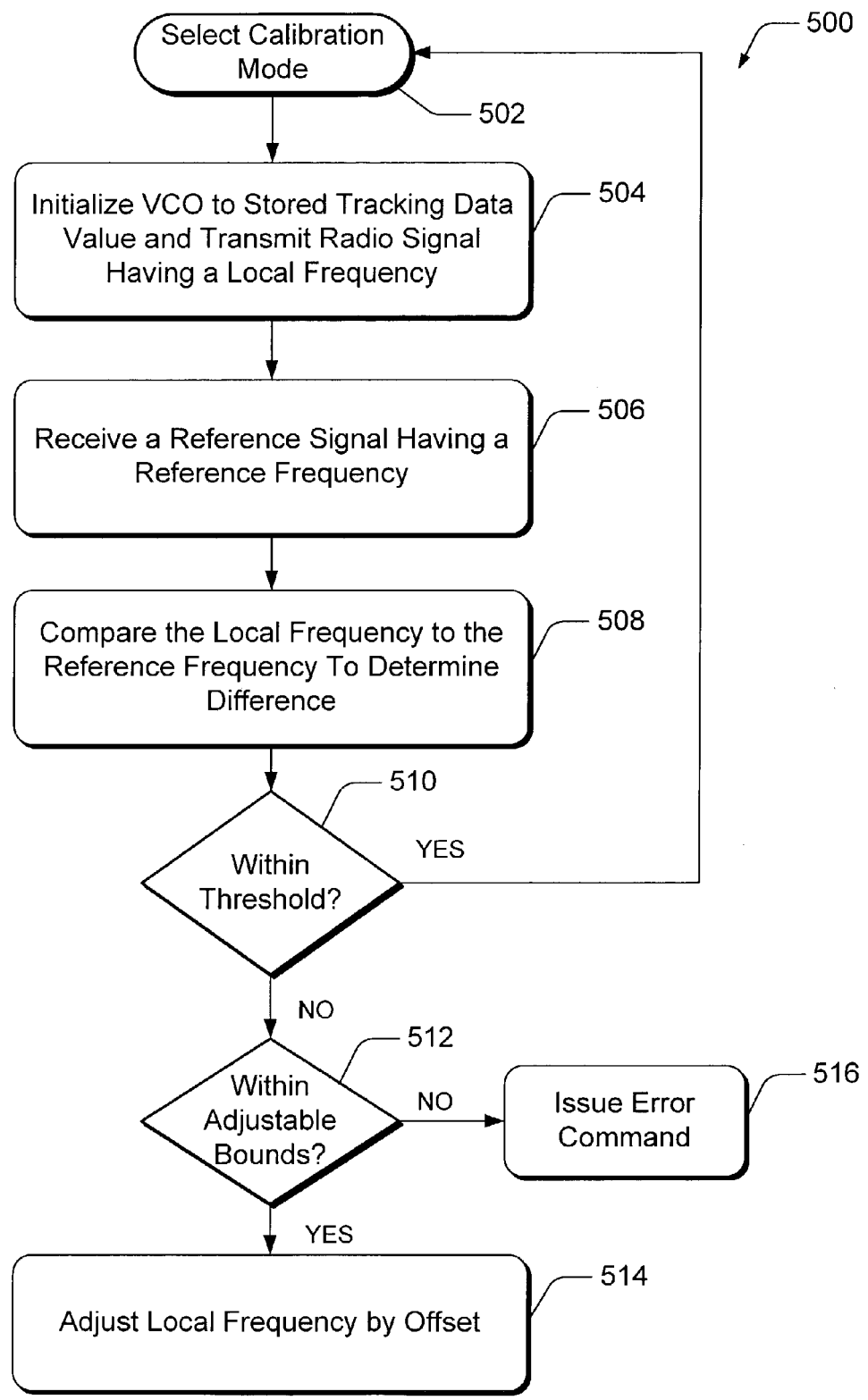
FIG. 5 is a flow chart illustrating an exemplary method for calibrating a radio.

FIG. 5 is a flow chart illustrating an exemplary method 500 for calibrating the radio 100. Method 500 includes blocks 502–516. The order in which the method is described is not intended to be construed as a limitation. Furthermore, the method 500 can be implemented in any suitable hardware, software, firmware, or combination thereof. In the exemplary implementation, method 500 is executed by processor(s) 102 in conjunction with the exemplary components described above.

In block 502, calibration mode 402 is selected. There are numerous ways to activate the calibration mode 402. For instance, the user interface and menu browser 120, in communication with the calibration system 330, can select the calibration mode 402 or normal mode 404. A host device (not shown) in communication with the calibration system 330 can also select the calibration mode 402 or normal mode 404. For example, if there is a desire to test whether radio 100 is accurately transmitting or receiving frequencies then calibration mode 402 is selected by (i) default settings or customer preferred settings; based on periodic intervals; (ii) a time when there is a belief that the frequency accuracy of local signals degraded; or (iii) when irregularities are observed by the calibration system 330 if the calibration system is continuously monitoring radio signal's frequencies produced oscillator 116 in a feedback loop, such as shown in system 300.

In blocks 504 and 506, reference VCO 320 is initialized. For example, when radio 100 is calibrated, either in the factory or automatically as described herein, tracking data 326 is stored in memory 324. The tracking data consists of calibrated values used to control VCO 320. The tracking data also enables radio 100 to lock onto (e.g., tune into) a reference signal and transmit a radio signal having a local frequency.

In block 508, the local frequency generated by the radio is compared to the reference frequency. The difference between the two frequencies may be calculated by integrating and averaging the base-band signal 313 (received from the A/D converter 314) for a period of time. In the exemplary illustration, calibration system 330 (FIG. 3) performs the integration and averaging functionality over 1 second. Of course, other techniques and sampling times could be used to determine the difference between the reference and local frequencies. If the difference between the two frequencies (reference frequency versus local frequency) does not equal zero, then calibration system 330 has established that the radio signal is not the same as the reference signal.

In decisional block 510, a determination is made whether the value associated with difference is below a particular threshold value. The threshold value can be set by a user depending on how accurate the user desires the radio to be or the threshold value can be pre-selected in the factory and stored in memory 324. If, according to the YES branch of decisional block 510, the difference between the two frequencies is below the threshold, then calibration system 330 considers the two signals practically identical and no further action is taken. Accordingly, method 500 can repeat itself at block 502 at a later time. On the other hand, if, according to the NO branch of decisional block 510, the value associated with the difference between the two signals exceeds the threshold value, then method 500 proceeds to decisional block 512. It should be noted that the threshold value can be set to zero if there is a desire to require calibration for any differences detected between the reference signal and radio signal (effectively eliminating operations performed in block 510).

In decisional block 512, assuming there is a difference between the reference signal and local radio signal, then a determination is made whether the difference is within an adjustable bounds. If the difference between the two signals is greater than the maximum adjustable bounds (a maximum threshold value), the calibration system 330 is unable to adjust the frequency of the radio signal automatically. A conclusion is made, therefore, that there is some type of malfunction with the radio that requires manual repair. Accordingly, in block 516, an error command is issued. The error command may be displayed on display panel 122 or user interface 120, to notify the user of radio 100 that there is a malfunction with the radio.

If, according to the YES branch of decisional block 512, the difference between the two frequencies associated with the reference signal and radio signals is within the adjustable bounds, then according to block 514, calibration system 330 adjusts the local frequency produced by oscillator 116. Accordingly, oscillator 116 is recalibrated so that the local frequency produced by the oscillator 116 effectively matches the reference frequency.

The correction value(s) generated by calibration system 330 can also be stored as updated tracking data in memory 324 so that when radio 100 is in the normal mode 404, the updated tracking data can be applied to the reference VCO 320 to offset voltages produced by reference VCO 320. Based on the foregoing; calibration system 330 is capable of self-calibrating radio 100 automatically.

Although some implementations of the various methods and arrangements of the present invention have been illustrated in the accompanying Drawings and described in the foregoing Detailed Description, it will be understood that the invention is not limited to the exemplary aspects disclosed, but is capable of numerous rearrangements, modifications and substitutions without departing from the spirit of the invention as set forth and defined by the following claims.

What is claimed is:

1. A radio configured to transmit a radio signal having a frequency based on a local oscillator, comprising:
    a local oscillator;
    a mixer coupled to receive a local oscillator signal from the local oscillator and a reference signal;
    an analog to digital converter coupled to receive an output of the mixer;
    a processor coupled to receive an output of the analog to digital converter, the processor configured to operate in a calibration mode to automatically calibrate the local oscillator by comparing the output of the analog to digital converter to a first threshold value, by integrating and averaging the output of the analog to digital converter, to determine a difference between a frequency of the local oscillator and the reference frequency, and adjusting the frequency of the local oscillator by an offset frequency that is a function of the difference, if the difference between the frequency of the local oscillator and the reference frequency is greater than the first threshold value; and
    a transmitter configured to transmit a radio signal having a local frequency;
    wherein the processor is further configured to permit selection between the calibration mode and a normal mode operable to transmit a radio signal, wherein the processor further stores tracking data indicative of the offset frequency determined during the calibration mode and wherein the stored tracking data is used in the normal mode to apply an offset correction voltage to the local oscillator so as to continuously adjust the local frequency by the offset frequency, and further wherein the processor updates the tracking data responsive to the difference between the frequency of the local oscillator and the reference frequency.

2. The radio as recited in claim 1, wherein the reference signal is received from a calibrated control channel base station.

3. The radio as recited in claim 1, wherein the calibration system is further configured to issue an error command if the difference between the frequency of the local oscillator and the reference frequency is greater than a second threshold value.

4. The radio as recited in claim 1, wherein the radio is a mobile radio.

5. The radio as recited in claim 1, wherein said local oscillator comprises a voltage controlled oscillator and synthesizer.

6. The radio as recited in claim 1, wherein the radio is a wireless device capable of receiving and transmitting radio signals.

7. The radio as recited in claim 1, wherein the calibration mode is selected by a user interface.

8. The radio as recited in claim 1, wherein the calibration mode is selected on a periodic basis.

9. The radio as recited in claim 1, wherein the calibration mode is selected when the radio receives a particular indication.

10. A method for automatically calibrating a radio, comprising:
    receiving a reference signal having a reference frequency;
    generating a local oscillator radio signal having a local frequency;
    mixing the reference signal with the local oscillator signal to generate a comparison signal;
    converting the comparison signal to a digital comparison signal;
    comparing the digital comparison signal to a first threshold value, by integrating and averaging the comparison signal, to determine a difference between the local frequency and the reference frequency;
    adjusting the local frequency by an offset frequency that is a function of the difference, if the difference between the frequency of the local oscillator and the reference frequency is greater than the first threshold value;
    storing tracking data indicative of the offset frequency;
    permitting selection between a calibration mode in which said local oscillator is calibrated and a normal mode operable to transmit a radio signal by continuously adjusting the local frequency by the offset frequency;
    applying an offset correction voltage to the local oscillator in the normal mode so as to continuously adjust the local frequency by the offset frequency when the radio is transmitting a signal; and
    updating the tracking data responsive to the difference between the frequency of the local oscillator and the reference frequency.

11. The method as recited in claim 10, wherein the reference signal is received from a control channel base station.

12. The method as recited in claim 10, further comprising issuing an error command if the difference between the local frequency and the reference frequency is greater than a second threshold value.

13. The method as recited in claim 10, wherein the reference signal is received from a calibrated source.

* * * * *